United States Patent [19]
Cheng et al.

[11] Patent Number: 5,634,803
[45] Date of Patent: Jun. 3, 1997

[54] EJECTOR FOR USE WITH A CARD EDGE CONNECTOR

[75] Inventors: Lee M. Cheng, Cupertino, Calif.; George Lee, Taipei, Taiwan

[73] Assignee: Hon Hai Precision Ind. Co., Ltd., Taiwan

[21] Appl. No.: 420,478

[22] Filed: Apr. 12, 1995

[51] Int. Cl.$^6$ .................................................. H01R 13/62
[52] U.S. Cl. .......................................... 439/157; 439/160
[58] Field of Search ................................ 439/160, 157, 439/159, 155, 152

[56] References Cited

U.S. PATENT DOCUMENTS

| 5,057,029 | 10/1991 | Noorily | 439/160 |
| 5,074,800 | 12/1991 | Sasao et al. | 439/157 |
| 5,364,282 | 11/1994 | Tondreault | 439/157 |

FOREIGN PATENT DOCUMENTS

| 2241841 | 9/1991 | United Kingdom | 439/160 |

Primary Examiner—Neil Abrams
Assistant Examiner—Eugene G. Byrd

[57] ABSTRACT

A DIMM connector (10) includes an elongated insulative housing (12) with a central slot (14) for receiving a DIMM (100) therein wherein two rows of contacts are positioned by two sides of the slot (14). A pair of cavities (22) are provided at two opposite ends of the housing (12) for receiving a pair of corresponding latch/eject members (70) therein. Rotation restriction means for limiting the rotation of the latch/eject member (70) with regard to the housing (12), includes a first engagement surface (85) provided on the eject portion (78) of the latch/eject member (70) and a second engagement surface (42) provided on the housing (12). A reinforcement wall (32) is transversely provided of the housing (12) and substantially between two side walls (24), but does not obstruct the assembling of the latch/eject member (70) into the cavity (22) in the housing (12).

6 Claims, 11 Drawing Sheets

EJECTOR FOR USE WITH A CARD EDGE CONNECTOR

BACKGROUND OF THE INVENTION

1. Field of the Invention

The invention relates to ejector means for use with a card edge connector, particularly to the ejector which is adapted to be assembled to the housing of the connector, and includes a stopper to incorporate engagement means for preventing such ejector from over-rotation during releasing a card therefrom.

2. The Prior Art

Dual In-line Memory Module (DIMM) is more and more popular for use in the present PC industry, and thus it is required to have a DIMM socket connector mounted on the mother board for mechanical and electrical reception of the corresponding DIMM therein for signal transmission between the mother board and the DIMM. Some of the DIMM connectors may be referred to U.S. Pat. Nos. 5,074,800, 5,167,517, 5,211,568, 5,302,133 and 5,364,282 wherein the main feature of the typical DIMM connector in comparison with the conventional card edge connector as shown in U.S. Pat. No. 4,846,734, is that the DIMM connector includes generally a pair of latch/eject members at its two opposite ends so that such DIMM may be not only properly latchably retained in the DIMM connector without possibility of inadvertent withdrawal by vibration or external impact, but also easily ejected from the DIMM connector by rotational movement of the latch/eject member.

As shown in FIG. 1 which is generally FIG. 1 of U.S. Pat. No. 5,364,282, the housing 2 of the connector 1 includes an opening 3 at either end in which the latch/eject member 4 is embedded for being adapted to not only lock the module 5 in the housing 2 in the latching status, but also eject the module 5 from the housing 2 in the unlatching status. Two problems may occur thereof wherein the first one is that there is no means for limiting the rotation of such latch/eject member 4 with regard to the housing 2 and that may result in hitting or jeopardizing the components which are mounted on the mother board closely adjacent to the end of the housing 2. The second one is that the opening 3 is substantially somewhat too large to jeopardize the strength of the corresponding portions of the housing 2, and it is desired to have a transverse wall positioned in the opening 3 which may efficiently provide a reinforcement for the spaced opposite side walls 6 around the opening 3. This reinforcement provision is desired because such pair of side walls 6 are substantially forced by the actuation forces which are imposed on the rotation spindles of the latch/eject member 4, and tend to be broken by such forces if no additional support means is properly connected to such pair of side walls 6 around or even in such opening 3. While, it is noted that because the latch/eject member 4 is generally loaded vertically into the housing 2 from the top, it is hardly possible to build an aforementioned support means approximate the opening 3 without obstructing the conventional vertical type assembling of the latch/eject member 4 in the connector 1.

Therefore, an object of the invention is to provide a DIMM connector having at least a latch/eject member at one end for releasably latching the DIMM therein wherein rotation restriction means is provided therewith for prohibiting the latch/eject member from over-rotation during ejecting the DIMM from the connector.

Another object of the invention is to provide a DIMM connector wherein the housing of the connector includes a reinforcement wall transversely positioned between the two opposite side walls approximate the opening, in which the latch/eject member is received, for enhancement of the structure strength around the opening but such reinforcement wall will substantially not obstruct the assembling of the latch/eject member 4 into the connector housing 2.

SUMMARY OF THE INVENTION

According to an aspect of the invention, a DIMM connector includes an elongated insulative housing with a central slot for receiving a DIMM therein wherein two rows of contacts are positioned on two sides of the slot. A pair of cavities are provided at two opposite ends of the housing for receiving a pair of corresponding latch/eject members therein. Rotation restriction means for limiting the rotation of the latch/eject member with regard to the housing, includes a first engagement surface provided on the eject portion of the latch/eject member and a second engagement surface provided on the housing.

A reinforcement wall is transversely provided with the housing and substantially between two side walls, but does not obstruct the assembling of the latch/eject member into the cavity in the housing.

BRIEF DESCRIPTION OF THE DRAWINGS

FIG. 2(A) is a perspective view Of the latch/eject member of the DIMM connector of FIG. 2.

DETAILED DESCRIPTION OF THE PREFERRED EMBODIMENT

Figure 1:
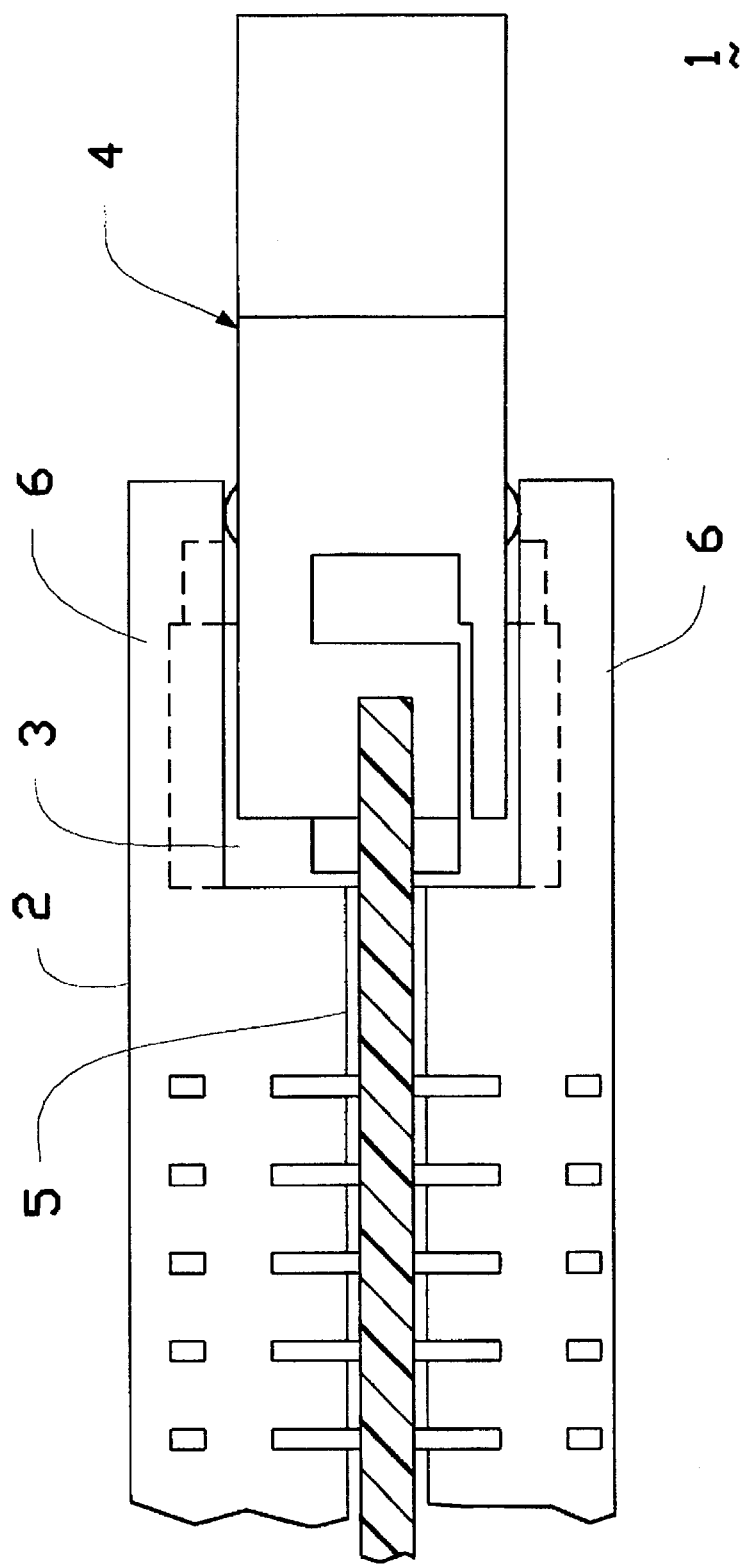
FIG. 1 is a top view of a prior art DIMM connector.
Figure 2:
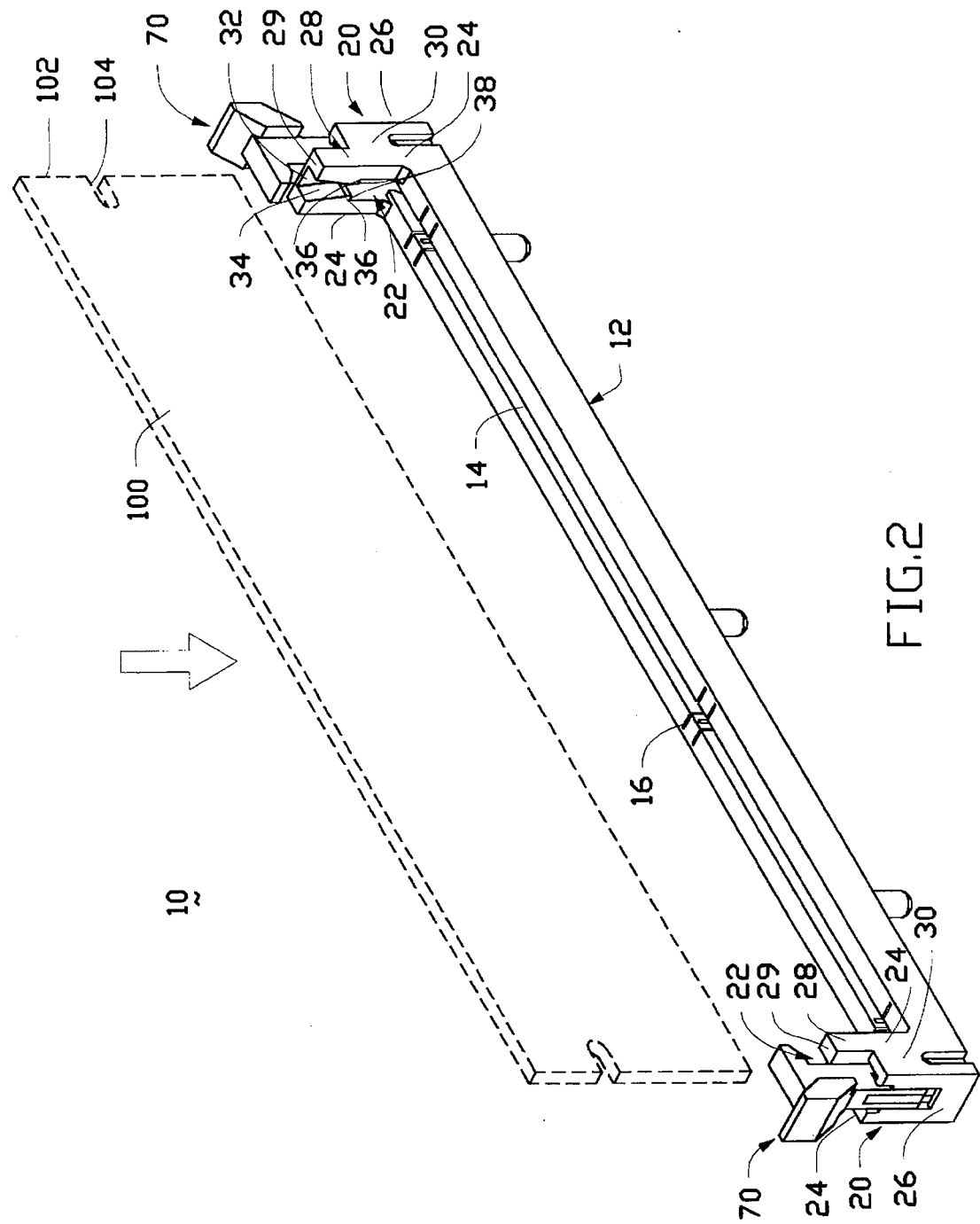
FIG. 2 is a perspective view of a DIMM connector according to the invention.
Figure 2:
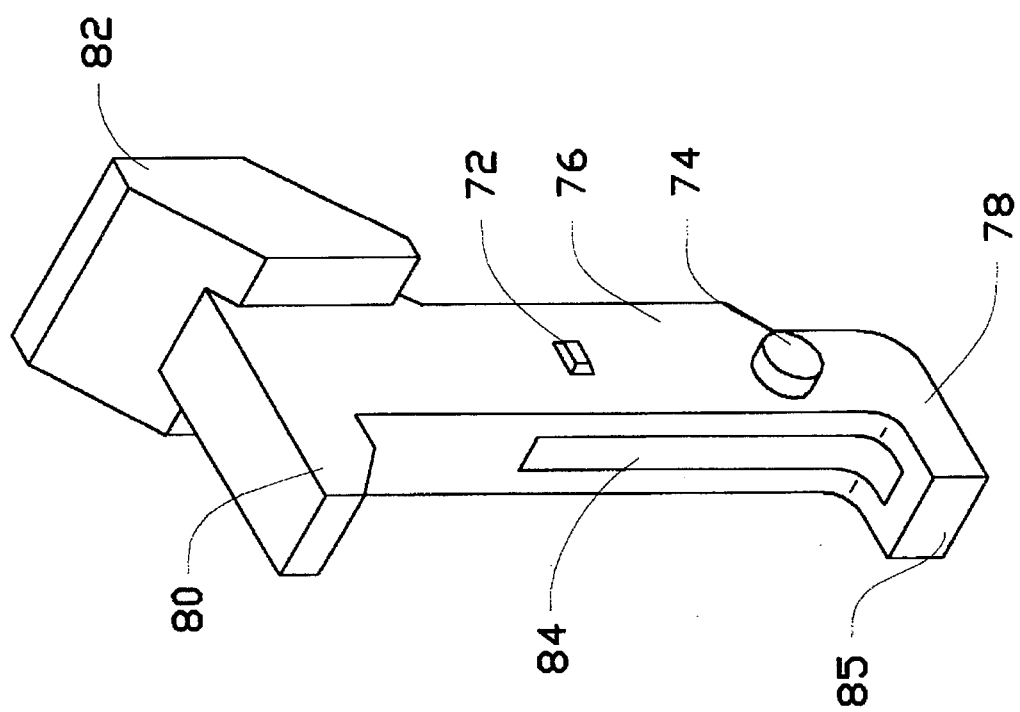

References will now be made in detail to the preferred embodiments of the invention. While the present invention has been described with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. Attention is now directed to FIGS. 2, 2(A) and 3(A)–3(C), a DIMM connector 10 includes an elongated insulative housing 12 having a central slot 14 extending along its lengthwise direction and two rows of contacts 16 positioned on two sides of the slot 14.

A pair of towers 20 integrally vertically extend from two ends of the housing 12 to respectively form a pair of cavities 22 for therein receiving a pair of corresponding latch/eject members 70 wherein the cavity 22 communicates with the central slot 14. The tower 20 is generally formed by a pair of side walls 24 and an end wall 26 around the cavity 22 wherein the tower 20 substantially is composed of a high section 28 close to the central slot 14 and a low section 30 at the outermost end of the housing 12.

Figure 3:
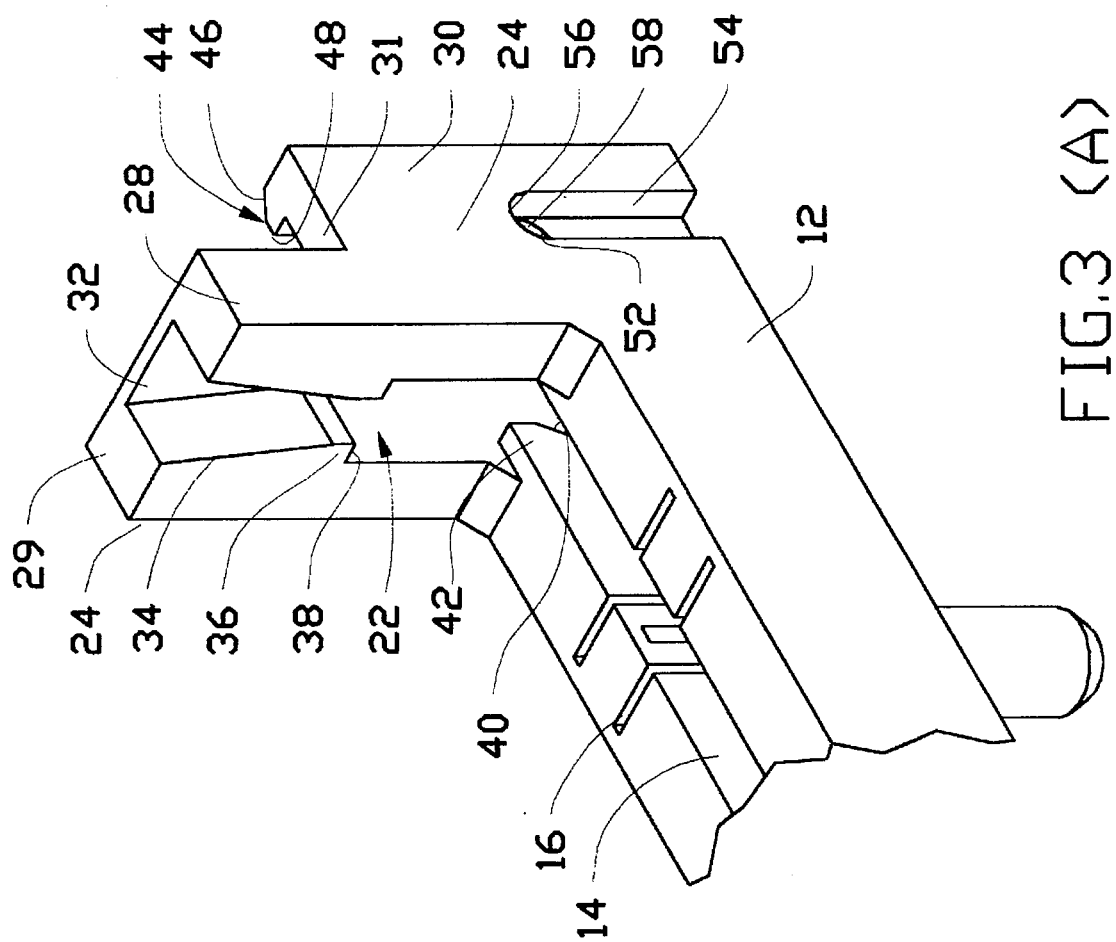
FIG. 3(A) is a right fragmentary perspective view of the DIMM connector of FIG. 2 without latch/eject member therein to show the inner structures around the cavity.
FIG. 3(B) is a left fragmentary perspective view of the DIMM connector of FIG. 2 to show the inner structures around the cavity which receives the above latch/eject member.
FIG. 3(C) is a fragmentary perspective view of the DIMM connector of FIG. 3(A) cut-away along the center line of the housing to further illustrate the inside channel therein.
Figure 3:
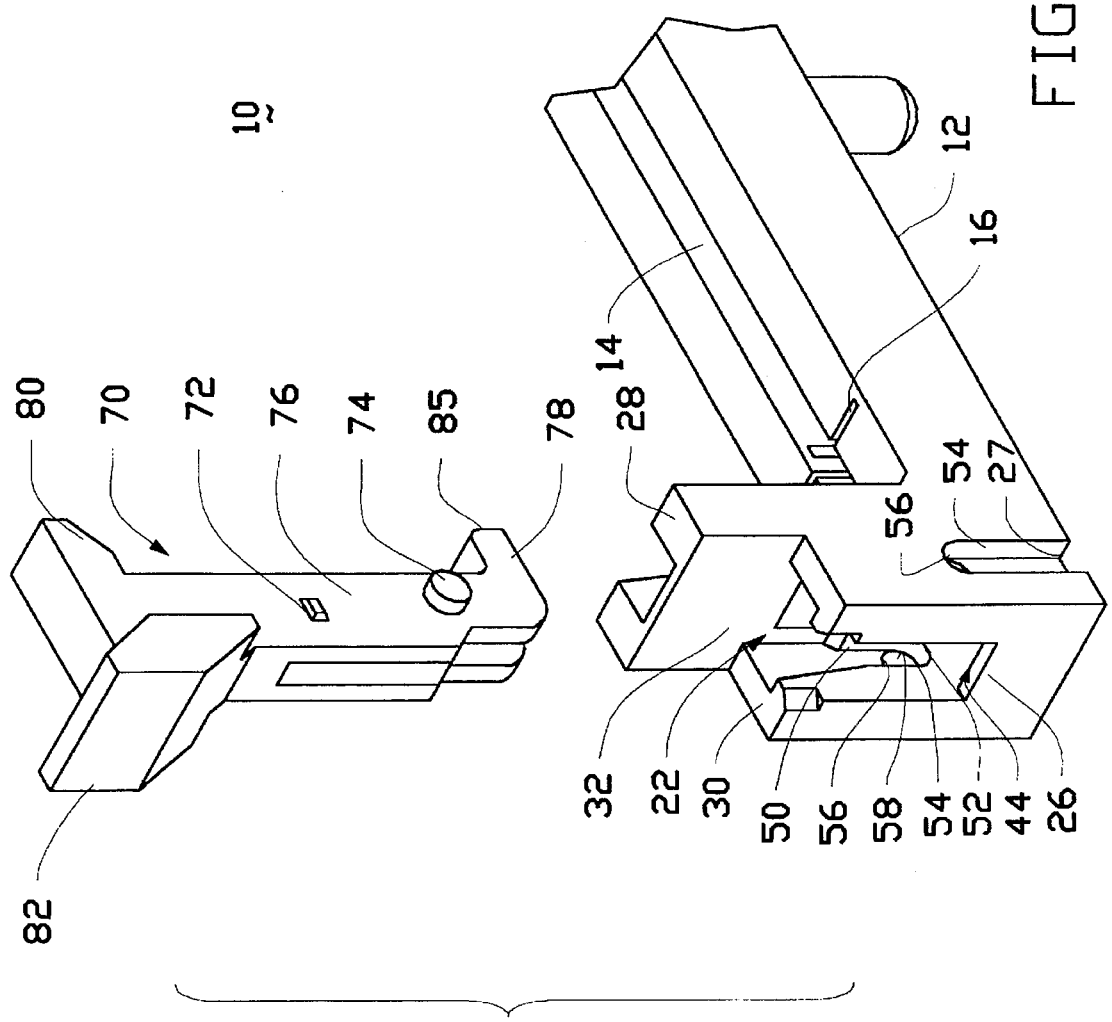
Figure 3:
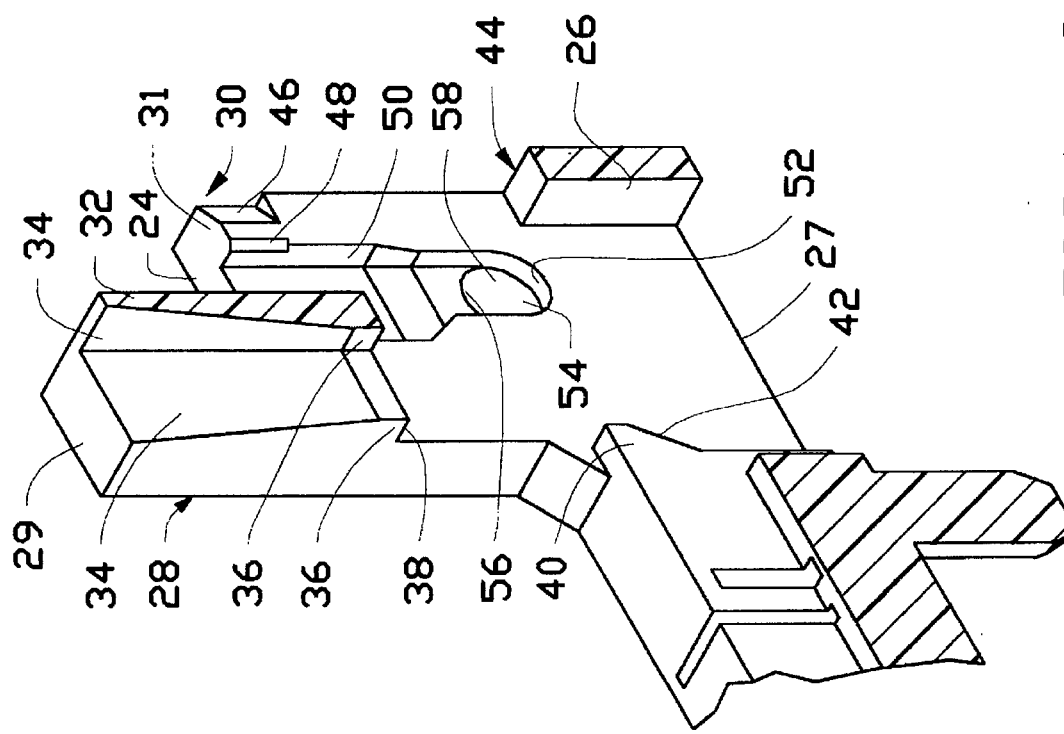

The high section 28 includes a reinforcement wall 32 (FIG. 3(B)) downward extending from the top surface 29 of the high section 28 but terminating around the mid-height of the high section 28 for not interrupting the cavity 22 in the tower 20. Chamfers 34 are formed at the top portion of the high section 28 for guidance of insertion of the card into the slot 14 of the housing 12. The distance defined between the apex portions 36 of the chamfers 34 of the side walls 24 is somewhat equal to the thickness of the inserted card, and the apex portion 36 of the chamfer 34 of the reinforcement wall 32 may abut against the side edge (102) of the inserted card (100), so that the inserted card (100) may be properly retained within the housing 12.

A shoulder 38 is formed under the apex portion 36 of the chamfer 34 of the side wall 24 to form the corresponding cavity 22 sufficiently large so that the latch/eject member 70 pivotally received therein may be of a dimension which is large and strong enough to actuate the inserted card (100) to eject out of the housing 12.

A pair of tapered engagement blocks 40 (only one shown in FIG. 3(C)) are respectively formed on two inner surfaces of the side walls 24 of the high section 28 adjacent the central slot 14, each including an engagement surface 42 facing obliquely downward cooperate with the latch/eject member 70 for limiting the rotation of the latch/eject member 70 in the cavity 22 described in detail later.

The height of the low section 30 generally is three-fourths of that of the high section 28. The end wall 26 includes an opening 44 at its top portion for allowing rotation of the latch/eject member 70 thereabout. An outer chamfer 46 and an inner chamfer 48 are respectively positioned on the inner surface of each side wall 24 adjacent either end wall 26, which facilitate passage of the dimples 72 of the latch/eject member 70 (FIG. 2(A)) during rotative moving of the latch/eject member 70 with regard to the housing 12.

A downward extending, from the top surface 31 of the lower section 30, inside channel 50 is recessed from the inner surface of the side wall 24 in the low section 30 with a rounded end 52. Correspondingly, an upward extending, from the bottom surface 27 of the lower section 30, outside channel 54 is recessed from the outer surface of the side wall 24 with a rounded end 56 (FIGS. 3(A) and 3(B)). Thus, the upward directing rounded end 52 of the inside channel 50 and the downward directing rounded end 56 of the outside channel 54 may cooperatively form a through hole 58 for receiving a spindle 74 of the latch/eject member 70 (FIG. 2(A)) therein. It can be understood that using this method to form a through hole 58 may not require slide core structures or side inserts during molding or forming the connector whereby there is no side pulling required in the molding process.

Referring to FIGS. 2(A), the latch/eject member 70 generally includes a main body 76 having an eject portion 78 horizontally extending at the bottom end and a locking portion 80 horizontally extending at the top end with a lever portion 82 obliquely upward extending opposite to the locking portion 80. As disclosed in an early time, positioned on two sides of the main body 76 are a pair of dimples 72 and a pair of spindles 74 below wherein such pair of spindles 74 are adapted to be received within the corresponding holes 58 in the lower section 30. To enhance resilience of the main body 76 for easy insertion of the spindles 74 into the corresponding holes 58 in the low section 30, a slit 84 is provided with the main body 76 of the latch/eject member 70 along its lengthwise direction.

Figure 4:
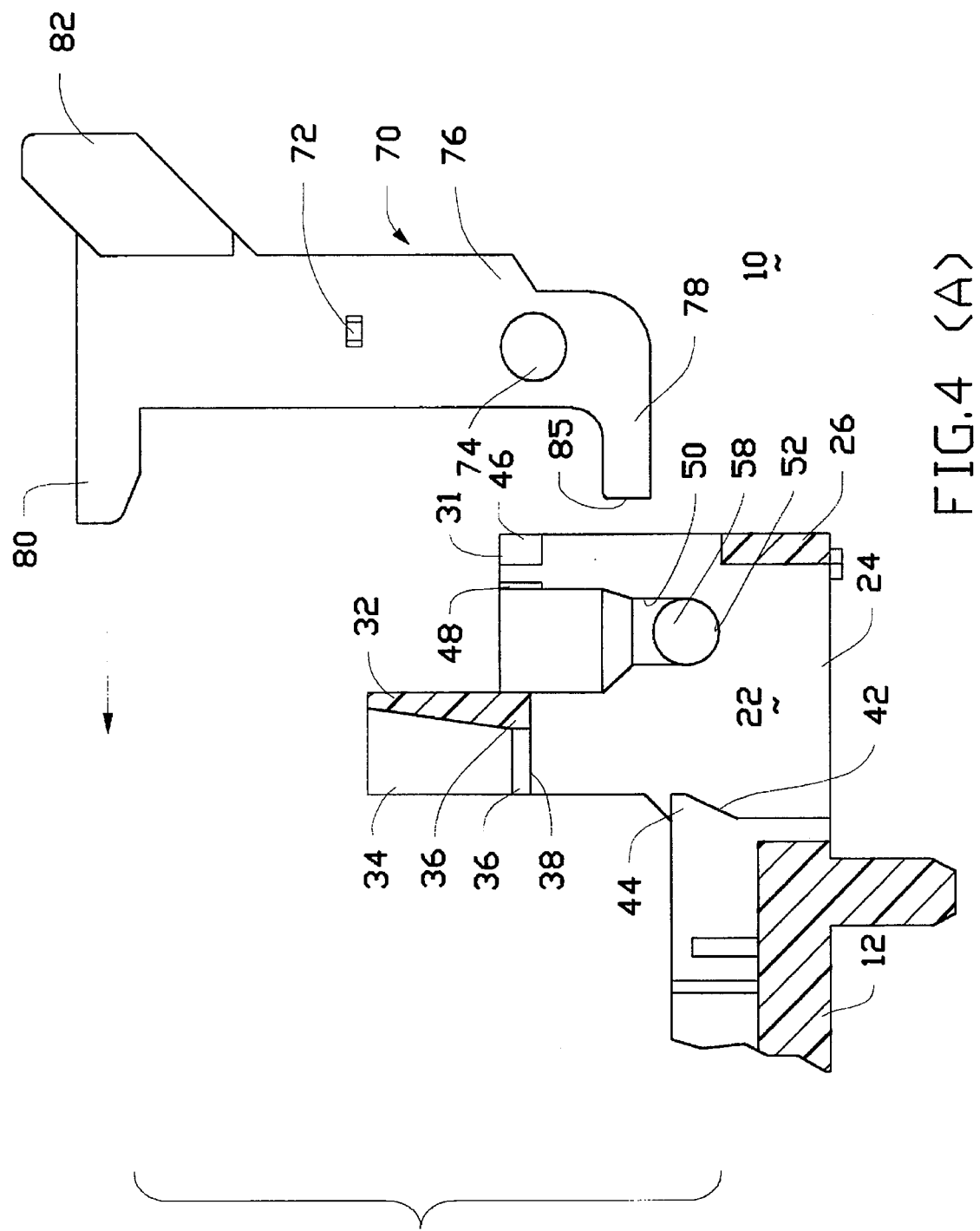
FIG. 4(A) is a vertical cross-sectional view of the DIMM connector of FIG. 2 to show the latch/eject member is first assembled to the tower of the housing horizontally.
FIG. 4(B) is a vertical cross-sectional view of the DIMM connector of FIG. 2 to show the latch/eject member is successively assembled into the tower of the housing vertically.
Figure 4:
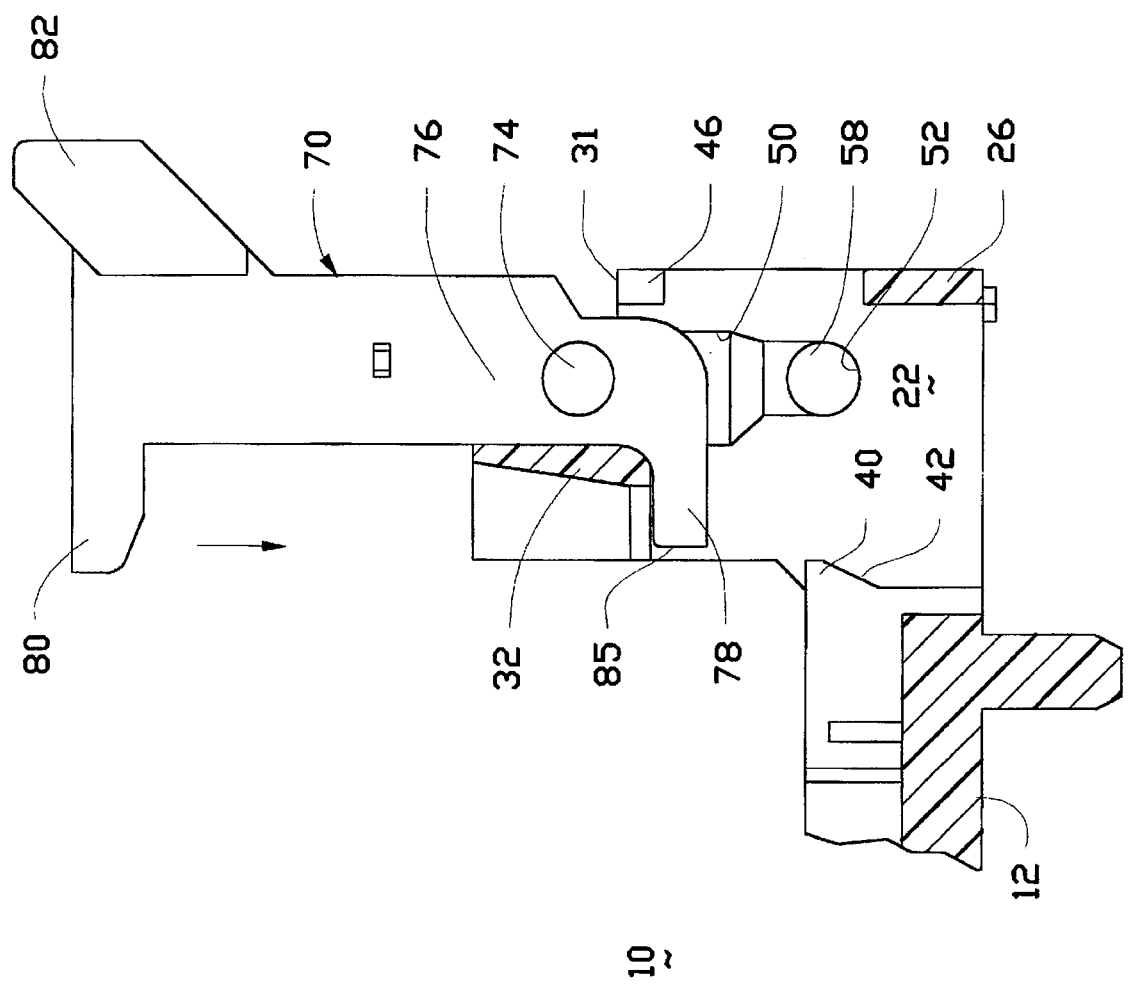
Figure 5:
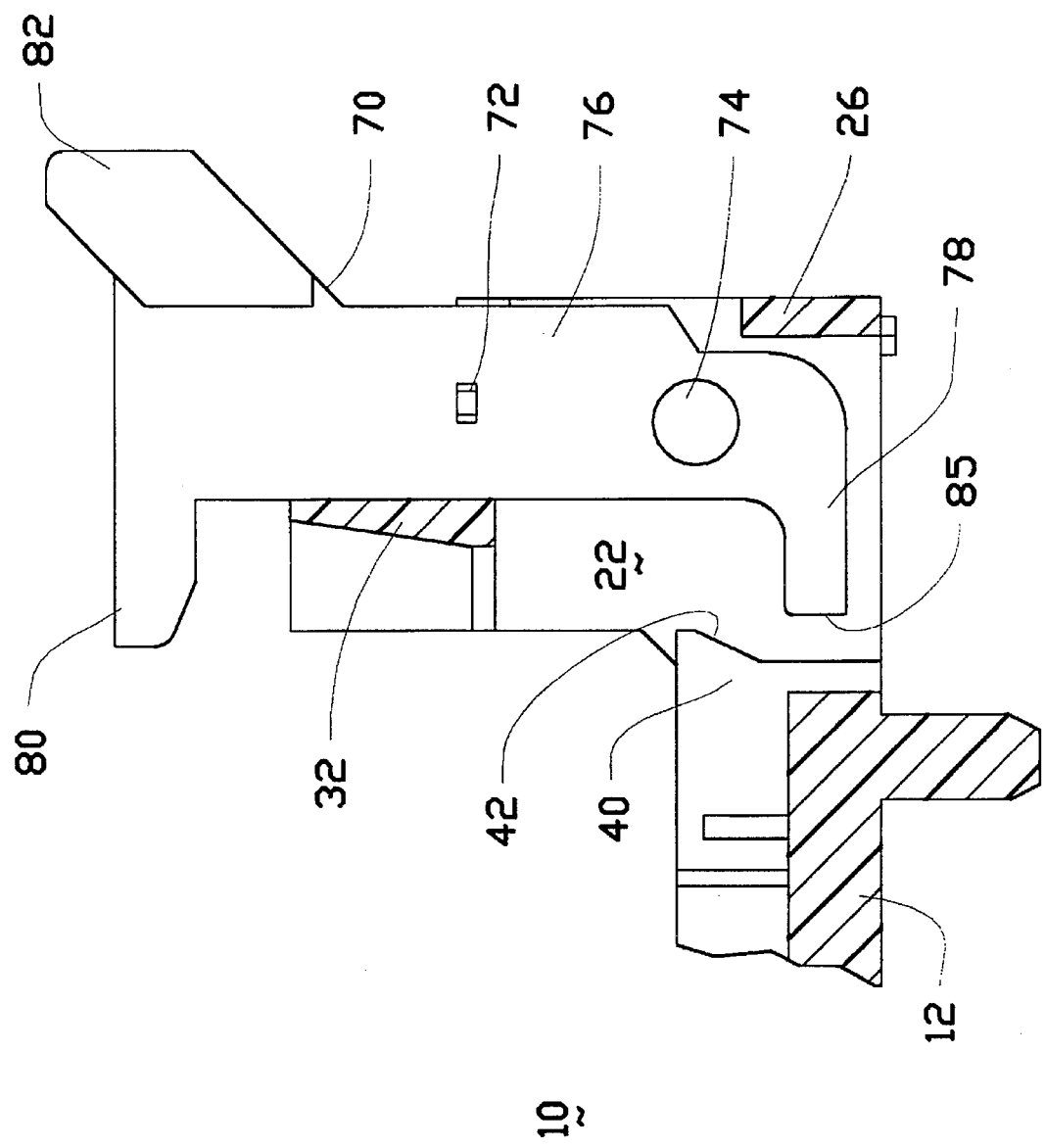
FIG. 5(A) is a vertical cross-sectional view of the DIMM connector of FIG. 2 located in a first (vertical) position for being able to lock the corresponding DIMM therein.
FIG. 5(B) is a vertical cross-sectional view of the DIMM connector of FIG. 2 to show the latch/eject member is located in a second (angular) position for being able to eject the corresponding DIMM therefrom.
Figure 5:
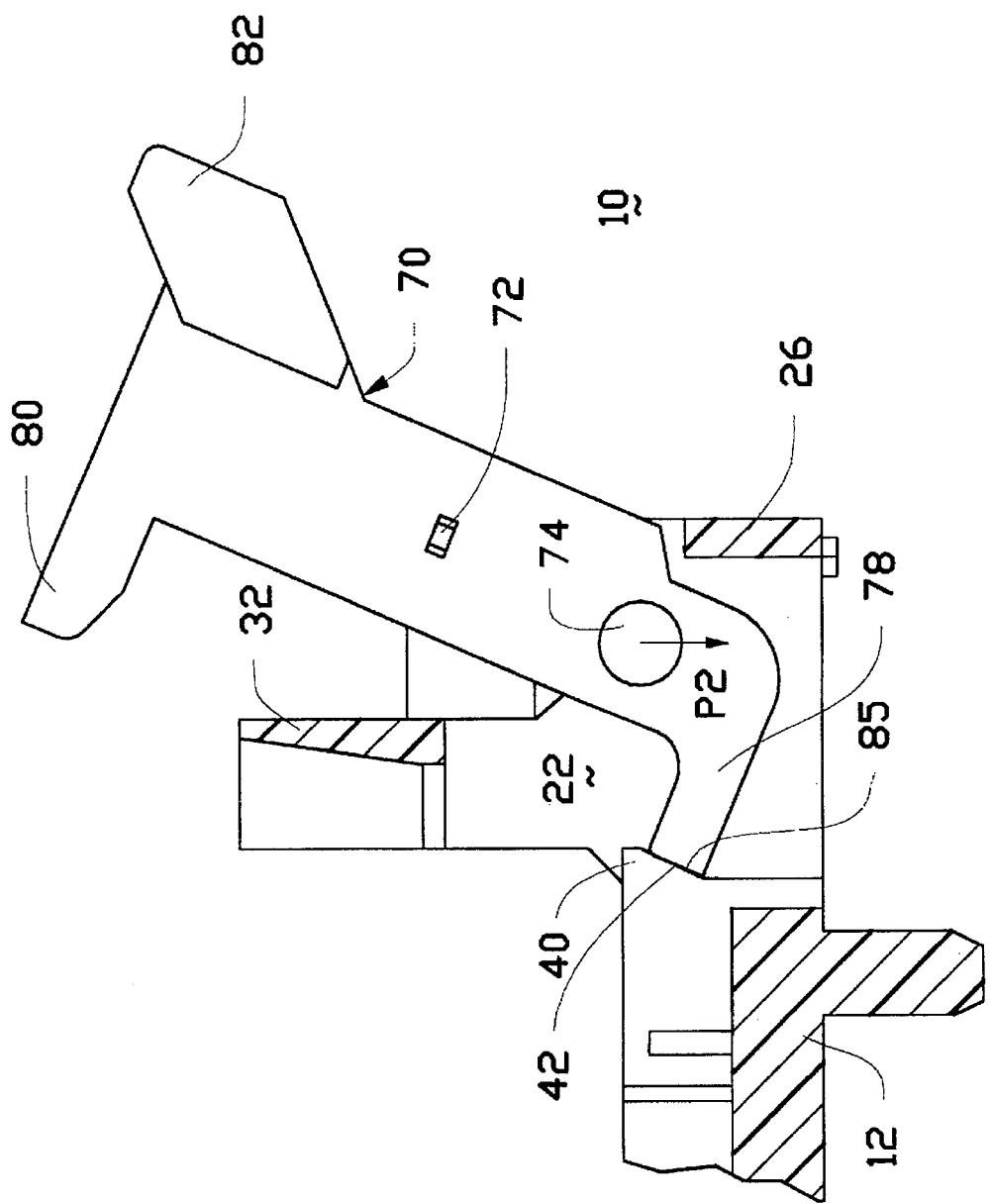

Referring to FIGS. 4(A), 4(B) and 5(A), when assembled, the latch/eject member 70 is first moved to the tower 20 of the housing 12 horizontally wherein the spindles 74 just pass closely over the top surface 31 of the low section 30 and the other portions of the latch/eject member 70 below the spindles 74 may pass thorough the opening 44 and into the cavity 22, until the main body 76 of the latch/eject member 70 confronts the reinforcement wall 32 of the high section 28 of the tower 20 (FIG. 4(B)). Then secondly, the latch/eject member 70 is vertically pressed down in a press-fit with the spindles 74 thereof moving along the inside channels 50 until such spindles 74 are properly received within the corresponding holes 58.

As disclosed and shown in the related prior arts, in the present invention, similarly the latch/eject member 70 may releasably latch the card (100), which is inserted and received with the slot 14 of the housing 12, by means of the locking portion 80 engaging the side notch (104) of the card (100). Different from the prior arts, the outward rotation of the latch/eject member 70 is substantially limited within a specific range by means that the front end surface 85 of the eject portion 78 abuts against the engagement surface 42 of the engagement block 40, during ejecting the inserted card (100) out of the housing 12 (FIG. 5(B)).

Two things may be deemed as features of the invention. The first is that the reinforcement wall 32 is provided between the high section 28 and the low section 30 of the tower 20. The reinforcement wall 32 offers not only enhancement of the structure around the cavity 22 for allowing forcible press-fit latch/eject member 70 within the cavity 22, (the press-fit assembling often making the corresponding spaced weak side walls of the housing broken in most common applications), but also efficiently align and limit the inserted card in the lengthwise direction of the housing 12. Most prior arts as shown in U.S. Pat. Nos. 5,074,800, 5,167,517, 5,211,568, 5,302,133 and 5,364,282, lack this structure and the corresponding advantage. It can be appreciated that it is impossible for the latch/eject member 70 to be directly vertically press-fit loaded into the cavity from the top because the eject portion 78 of the latch/eject member 70 will interfere with the reinforcement wall 32 during the vertical type assembling. Therefore, this is the reason why there should be the low section 30 beside the high section 28 that allows the eject portion 78 may moved to and under the reinforcement wall 32 by a horizontal moving first and then the latch/eject member 70 is moved in a vertical direction to its final fixed position wherein the low section 30 should be short enough to allow the lateral projecting spindles 74 to pass above without interference.

Figure 6:
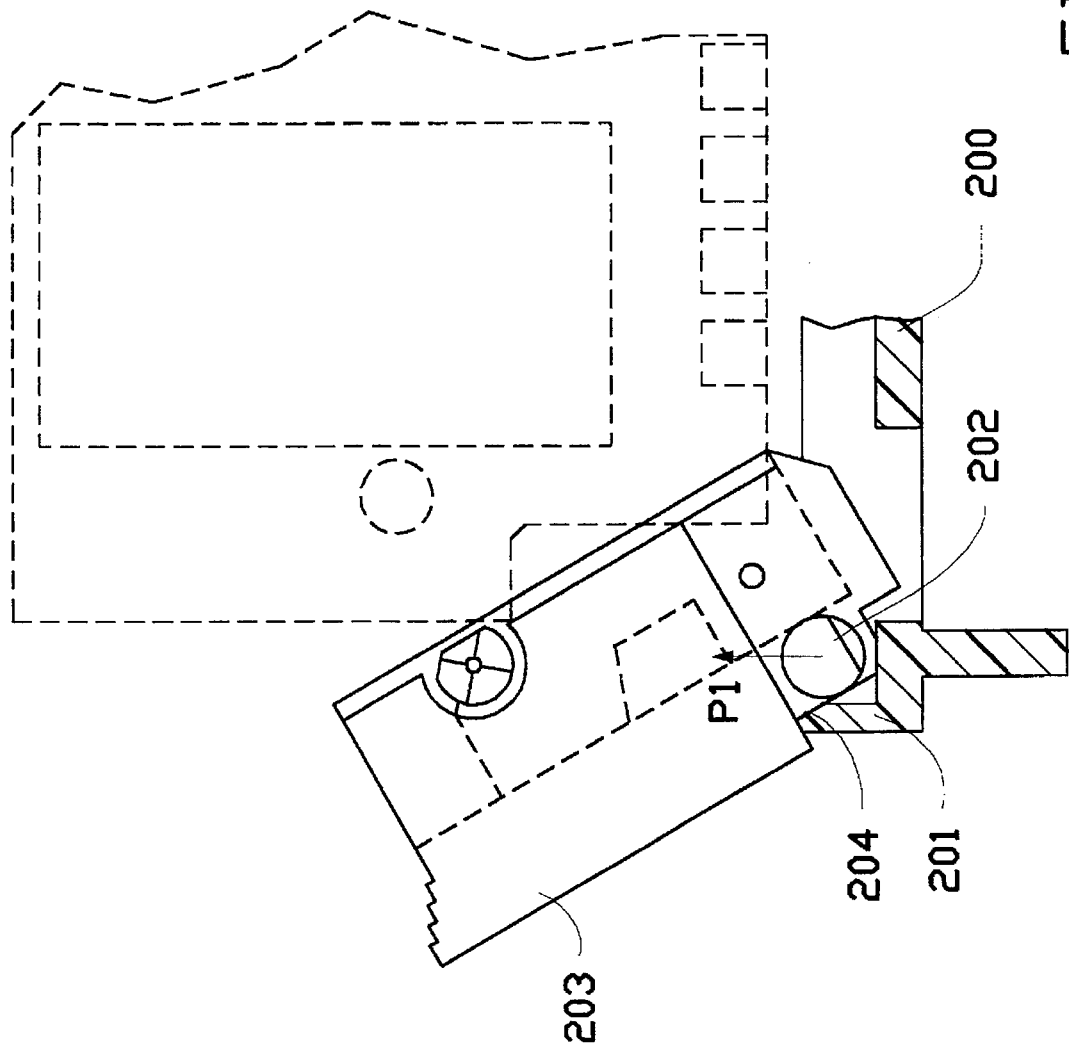
FIG. 6 is a fragmentary view to illustrate the improper support point occurring on the end wall near the final stage of rotation of the latch/eject member in some prior art card edge connectors.

The second is that the cooperation of the engagement block 40 adjacent the slot 14 with the eject portion 78 of the latch/eject member 70 substantially provides a limitation of rotation of the latch/eject member 70 thus avoiding the possible interference occurring between the lever portion 82 of the latch/eject member 70 and the electronic components which may be mounted closely aside the end of the connector housing 12. Most aforementioned prior arts lack this structures and the corresponding advantages. Comparatively, U.S. Pat. Nos. 5,108,298 and 5,167,517 disclose limiting mechanism using the end wall 201 of the housing 200, while such limiting means often forms a new support point at the top end 204 of such the end wall 201 during the final stage of the rotation of the latch/eject member 203, and that will result in the spindles 202 of the latch/eject member 203 tending to move upward as shown in FIG. 6 which is basically a main figure of U.S. Pat. No. 5,167,517. This intention (P1) of upward movement of the latch/eject member 203 may happen because such spindles 202 of the latch/eject member 203 are assembled to the housing 200 in a pressfit.

Differently and in contrast, as show in FIG. 5(B) of the invention, due to the downward facing engagement surface 42 of the engagement block 40, the engagement occurrence between the engagement block 40 and the eject portion 78 of the latch/eject member 70 may result in a downward movement intention (P2) for the spindles 74 of the latch/eject member 70 when the latch/eject member 70 is manually rotated by a force applied to the lever 82 of the latch/eject member 70, and that will be beneficial to enhance the securement of the spindles 74 of the latch/eject member 70 within the corresponding holes 58. It is nevertheless contemplated that the dimension and the position of the engagement block 40 should be carefully configured so that such engagement block 40 will not obstruct the assembling the latch/eject member 70 into the cavity 22 but still achieving the limitation function when the latch/eject member 70 is in its outermost angular open position. It is further noted that each pair of engagement blocks 40 should also not obstruct the insertion of the card (100) into the slot 14, so that the distance between such pair of engagement blocks 40 respectively and oppositely positioned on the inner surfaces of the side walls 24, is surely no less than the thickness of the inserted card (100).

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. An electrical connector for use with ejector means, comprising:

an insulative elongated housing with a plurality of contacts for electrical and mechanical engagement with an electronic component coupling to the housing of said connector; and at least one tower integrally formed at an end of said housing defined by a pair of side walls and an end wall to form a cavity for receiving said ejector means therein, said tower including a high section and a low section; a reinforcement wall integrally extending of the high section and generally being perpendicular to the side walls while not substantially interrupting said cavity in the tower for rotation of the ejector means therein; wherein said electronic component is a card, and the housing further comprises a central slot for receiving said card therein; said two side walls in the tower section limits a lateral movement of the card inserted within the slot, and the reinforcement wall in the tower section not only limits a lengthwise movement of the card within the slot but also confronts the ejector means.

2. The electrical connector as defined in claim 1, wherein said ejector means is substantially a latch/eject member including a main body having an eject portion at a bottom end and a locking portion at a top end, and a lever portion obliquely upward projecting opposite to the locking portion.

3. The electrical connector as defined in claim 2, wherein said ejector means further includes a pair of spindles on two sides of the main body whereby said pair of spindles must be positioned over the low section but the eject portion is positioned under the reinforcement wall during initially horizontally loading said eject means onto the tower.

4. The electrical connector as defined in claim 3, wherein said tower further includes a pair of inside channels for allowing the said pair of spindles to move along during successively vertically loading ejector means into the tower.

5. The electrical connector as defined in claim 2, wherein said housing further includes at least one engagement block having a downward facing engagement surface for engagement with a front end portion of the eject portion when said ejector means is rotated to its final angular position for limiting rotation of said ejector means whereby a force component about the spindle is directed downward.

6. An electrical connector with an ejector positioned adjacent to one end thereof, comprising:

an insulative elongated housing including a pair of side walls and a pair of end walls thereof and having a plurality of contacts therein;

said ejector being pivotally retained within the housing wherein the corresponding end wall of the housing has an opening at the top for not interfering with or engaging with the rotated ejector, and the housing further includes an engagement block having a downward facing engagement surface which is adapted to abut against an eject portion of said ejector for limitation of further rotation of the ejector; and wherein said connector is a card edge connector, the housing of which comprises a central slot beside which said plurality of contacts are located and said engagement block of the housing is positioned proximate said central slot but opposite to the end wall.

* * * * *